(12) United States Patent
Annapragada

(10) Patent No.: US 6,700,200 B1
(45) Date of Patent: Mar. 2, 2004

(54) RELIABLE VIA STRUCTURES HAVING HYDROPHOBIC INNER WALL SURFACES

(75) Inventor: Rao V. Annapragada, San Jose, CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/715,973

(22) Filed: Nov. 16, 2000

Related U.S. Application Data

(62) Division of application No. 09/234,235, filed on Jan. 20, 1999, now Pat. No. 6,165,905.

(51) Int. Cl.$^7$ .............................................. H01L 23/48
(52) U.S. Cl. ........................ 257/758; 257/773; 257/763
(58) Field of Search .............................. 257/758, 759, 257/774, 763, 364

(56) References Cited

U.S. PATENT DOCUMENTS

| | | | | |
|---|---|---|---|---|
| 5,270,267 A | * | 12/1993 | Ouellet ........................ 437/231 |
| 5,312,781 A | * | 5/1994 | Gregor et al. .............. 437/235 |
| 5,557,147 A | * | 9/1996 | Sugiura et al. ............. 257/763 |
| 5,759,906 A | * | 6/1998 | Lou ............................ 438/623 |
| 5,763,010 A | * | 6/1998 | Guo et al. ................ 427/376.2 |
| 6,028,360 A | * | 2/2000 | Nakamura et al. .......... 257/758 |
| 6,034,418 A | * | 3/2000 | Matsuura ..................... 257/632 |
| 6,144,097 A | * | 11/2000 | Asahina et al. ............. 257/751 |

OTHER PUBLICATIONS

Wolf, Stnaley, Silicon Processing for the VLSI Era 1990, Lattice Press, vol. 2: Process Integration, p. 278.*

* cited by examiner

Primary Examiner—Evan Pert
Assistant Examiner—Lourdes Cruz
(74) Attorney, Agent, or Firm—Peter Zawilski

(57) ABSTRACT

Disclosed is a method of making a reliable via hole in a semiconductor device layer, and a reliable via structure having internal wall surface layers that are hydrophobic, and thereby are non-moisture absorbing. The inner wall of the via structure has a layer of material having a characteristic of spin on glass (SOG), such that the characteristic is that the outer layer of the SOG oxidizes during photoresist ashing to form a surface layer of silicon dioxide in the via hole wall. In the method, the via structure is placed through a chemical dehydroxylation operation after the ashing operation, such that the layer of silicon dioxide in the via hole wall is converted into a hydrophobic material layer. The conversion is performed by introducing a halogen compound suitable for the chemical dehydroxylation operation, wherein the halogen compound may be $NH_4F$ or $CCl_4$.

17 Claims, 10 Drawing Sheets

US 6,700,200 B1

RELIABLE VIA STRUCTURES HAVING HYDROPHOBIC INNER WALL SURFACES

This application is a division of Ser. No. 09/234,235 filed Jan. 20, 1999, now U.S. Pat. No. 6,165,905.

BACKGROUND OF THE INVENTION

1. Field of the Invention

The present invention relates to reliable semiconductor via structures, and more particularly, the present invention relates to techniques for converting silicon dioxide layer regions within via hole walls into moisture repellant hydrophobic layer regions.

2. Description of the Related Art

In the fabrication of semiconductor devices, various layers are provided with conductive material, such as metal lines. The metal lines are commonly formed over successive insulating dielectric layers. Accordingly, it is generally necessary to electrically interconnect the metal lines between the dielectric layers. To accomplish this, vias (or via holes) are formed through the dielectric layers to electrically interconnect selected metal lines or features.

Spin on glass material ("SOG material") is used for some of the dielectric layers. For example, so-called "true" SOG materials, such as that sold under the brand name "LSU 418," which is available from Allied Signal, Inc. of Sunnyvale, Calif., is used because it has a low k characteristic (e.g., dielectric constant less than 4.0, which is common for silicon dioxide). Many "SOG-like" materials also have a low k characteristic. The SOG-like materials may, for example, be spin coated or result from vapor deposition using methyl silane and hydrogen peroxide chemistry. However, both the true SOG materials and the SOG-like materials oxidize during and after an operation known as ashing. Ashing is commonly performed to remove a photoresist layer that has been spin coated over the SOG material to facilitate patterning operations. Unfortunately, the oxidized SOG materials are known to absorb too much moisture from the atmosphere, in that during later operations (such as, for example, during metal deposition), the absorbed moisture outgasses causing poisoning of the vias. Such poisoning prevents adequate electrical connections from being made, e.g., between the opposite metal layers which are to be interconnected by way of the conductive material in the vias.

Unfortunately, prior art attempts to reduce the amount of the moisture retained by the oxidized SOG materials have not been successful. For example, if thermal outgassing is performed at a high enough temperatures to remove adequate amounts of the moisture (e.g., at about 700 degrees C.) from the oxidized SOG materials, significant problems result. These high outgassing temperatures are generally considered too excessive for the metal layers to withstand without causing damage (e.g., metal layers of aluminum may deform). Also, the SOG material is not stable at the high outgassing temperatures. If lower temperatures are used in an attempt to reduce the moisture retained by the oxidized SOG materials (e.g., at 400 to 450 degrees C. in a PVD chamber), although the metal lines may not be damaged by the temperature, not enough of the moisture is removed. The remaining moisture then outgasses during later attempts to deposit via coating/filling materials such as titanium nitride (TiN) and tungsten (W) metal layers (which are commonly used for the conductive vias), and such outgassing prevents proper continuous deposition of these metal layers in the internal via walls. For example, the outgassing moisture may prevent tungsten from being deposited on the walls of the via, and the TiN will tend to deposit discontinuously (e.g., in separate random groups), rather than in a complete conductive layer.

To facilitate this discussion, FIG. 1A shows a semiconductor structure including a substrate 101 supporting a first conductor 102, such as a metal line, which is to be in contact with a second conductor 103, such as a conductive layer of titanium nitride shown in FIG. 1C. Deposited on the substrate 101 is a layer 104 of SOG material, which may include both true SOG materials, materials having a SOG-like characteristic, and other organic low-K dielectric materials. Accordingly, such characteristic includes having a low dielectric constant (K), and oxidizing during photoresist ashing to form a surface layer 106 of silicon dioxide. After deposition of a silicon dioxide layer 107 on the layer 104 of SOG material, a via hole 109 is formed through the silicon dioxide layer 107 and through the SOG material layer 104 to expose the metal 102 as shown in FIG. 1A.

Between the etching operation and a subsequent deposition operation, a semiconductor structure 111 defined by the substrate 101 and the layers 102, 104, and 107, is exposed to oxygen in the atmosphere. The oxygen thus causes the inner wall surface of the via hole 109 to oxidize and form the surface layer 106. As described above, the surface layer 106 is very porous, is prone to collect moisture, and upon being heated, releases gaseous moisture.

The effect of the release of the moisture is shown in FIG. 1C, which depicts operations intended to deposit a layer 103 of titanium nitride under a layer 114 of tungsten. The purpose of the titanium nitride layer 103 is to electrically interconnect the first conductor 102 to the tungsten layer 114. However, FIG. 1C shows arrows 116 depicting moisture being outgassed from the surface layer 106 during the deposition of the titanium nitride layer 103. The outgassed moisture prevents the layer 103 of titanium nitride from being continuous, as illustrated by the spaced pieces 103a of titanium nitride. It may be understood, then, that the word "layer" in the phrase "layer 103" denotes the desired form of the titanium nitride, whereas the actual form of the prior art titanium nitride layer is discontinuous as shown in FIG. 1C. Because the pieces 103a are spaced, the desired electrical interconnection from the metal 102 to the tungsten 114 is not achieved.

Moreover, when an attempt is made to deposit the tungsten layer 114 after the titanium nitride pieces 103a, the tungsten layer 114 tends to stop short of filling the via, leaving a void 119 shown in FIGS. 1C and 1D. The void 119 is filled with neither titanium nitride nor tungsten, such that there is a high likelihood that there will be no electrical conductivity from the metal 102 to the tungsten layer 114.

In view of the forgoing, there is an unfilled need for a reliable semiconductor via structure, and a method of making reliable via structures to prevent outgassing problems and associated via hole voids.

SUMMARY OF THE INVENTION

Broadly speaking, the present invention fills these needs by providing improved semiconductor device via structures having an inner hydrophobic wall surface layer to prevent the aforementioned moisture absorption and subsequent outgassing. Such via structures are made using techniques for converting a silicon dioxide inner wall layer into the desirable hydrophobic layer, thus preventing the failure inducing voids in the via structures. It should be appreciated that the present invention can be implemented in numerous ways, including as a process, an apparatus, a system, a device, or a method. Several inventive embodiments of the present invention are described below.

In one embodiment, a method of making a via hole in a semiconductor structure is disclosed. The via hole has a surface layer of hydrophobic material, and includes an outer layer of a material having a characteristic of SOG materials. The characteristic is that the outer layer oxidizes during photoresist ashing to form a surface layer of silicon dioxide in the via hole. In the method, an operation is performed after the ashing. The operation includes performing a chemical dehydroxylation operation on the surface layer of silicon dioxide to convert the surface layer of silicon dioxide to the surface layer of hydrophobic material. To achieve this, the semiconductor structure is placed in a closed process chamber, and then, a halogen compound is admitted into the process chamber to facilitate the chemical dehydroxylation operation. In this embodiment, the halogen compound is selected from either $NH_4F$, other gaseous combination including fluorine, or $CCl_4$.

In an other embodiment, a method of malting a via hole in a semiconductor device is disclosed. The method includes defining a via hole having a wall surface that at least partially has a characteristic of spin on glass materials. The characteristic being that the wall surface oxidizes during a photoresist ashing operation and the oxidizing converts the wall surface into a silicon dioxide skin. The method then includes placing the semiconductor device in a process chamber. Once the semiconductor device is placed in the process chamber, the method includes introducing a halogen gas into the process chamber to cause a chemical dehydroxylation of the silicon dioxide skin to thereby convert the silicon dioxide skin into a hydrophobic material skin, such that the hydrophobic skin is part of the wall surface of the via hole.

In still another embodiment, a semiconductor via structure that is configured to be defined through an inter-metal dielectric is disclosed. The structure includes a first conductive pattern element. A layer of SOG material formed over the first conductive pattern element. The layer of SOG material having a via hole defined therethrough, such that the via hole defines a path to the first conductive pattern element. The via hole has a via wall surface that is defined along the SOG material that extends to the first conductive pattern element, and the via wall surface has a hydrophobic material layer. In this embodiment, the hydrophobic material layer is a reaction product of silicon dioxide and a halogen compound. The halogen compound may be $NH_4F$ or $CCl_4$, and when the $CCl_4$ is used, the via hole fill material that will be in contact with the hydrophobic material layer is preferably copper.

As an advantage of each of such embodiments, no high temperature outgassing is required to avoid the disadvantages of the oxidized SOG layer, e.g., the silicon dioxide layer that is formed in the SOG after typical ashing operations. Other aspects and advantages of the present invention will become apparent from the following detailed description, taken in conjunction with the accompanying drawings, illustrating by way of example the principles of the present invention.

BRIEF DESCRIPTION OF THE DRAWINGS

The present invention will be readily understood by the following detailed description in conjunction with the accompanying drawings. Therefore, like reference numerals designate like structural elements.

DETAILED DESCRIPTION OF THE PREFERRED EMBODIMENTS

An invention for reliable via structures, and methods for making reliable via structures in semiconductor devices, which circumvent the aforementioned problems of via voids and associated outgassing, is disclosed. In a preferred embodiment, the reliable via structures are made to have a via wall surface layer that is hydrophobic. As such, the via wall surface layer will substantially not absorb moisture, which is a major contributing factor of conductive via voids. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to obscure the present invention.

Figure 1A:
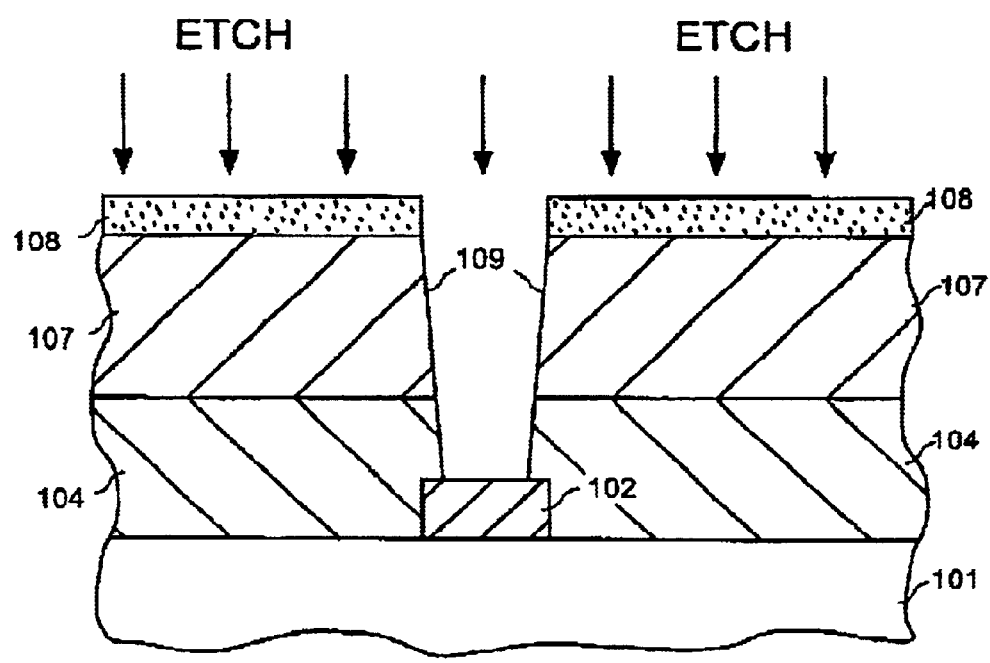
FIG. 1A is a cross sectional view of a prior art semiconductor structure showing a via formed through a layer of SOG material at a location defined by photoresist.
Figure 1B:
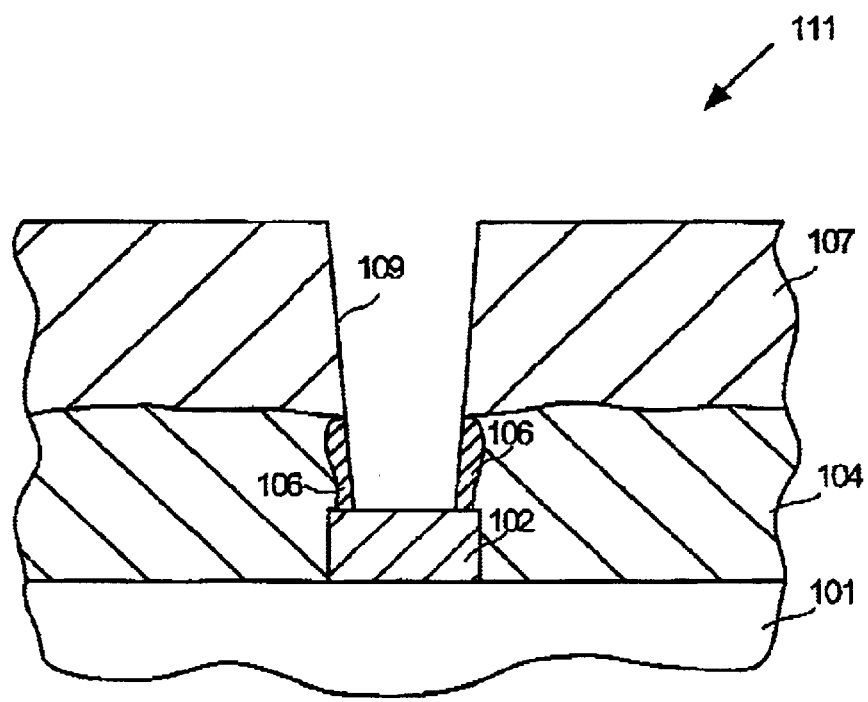
FIG. 1B is a cross sectional view of the semiconductor structure shown in FIG. 1A after an ashing operation has been performed to remove the photoresist, wherein an undesired surface layer of oxidized SOG material is formed after the ashing operation.
Figure 1C:
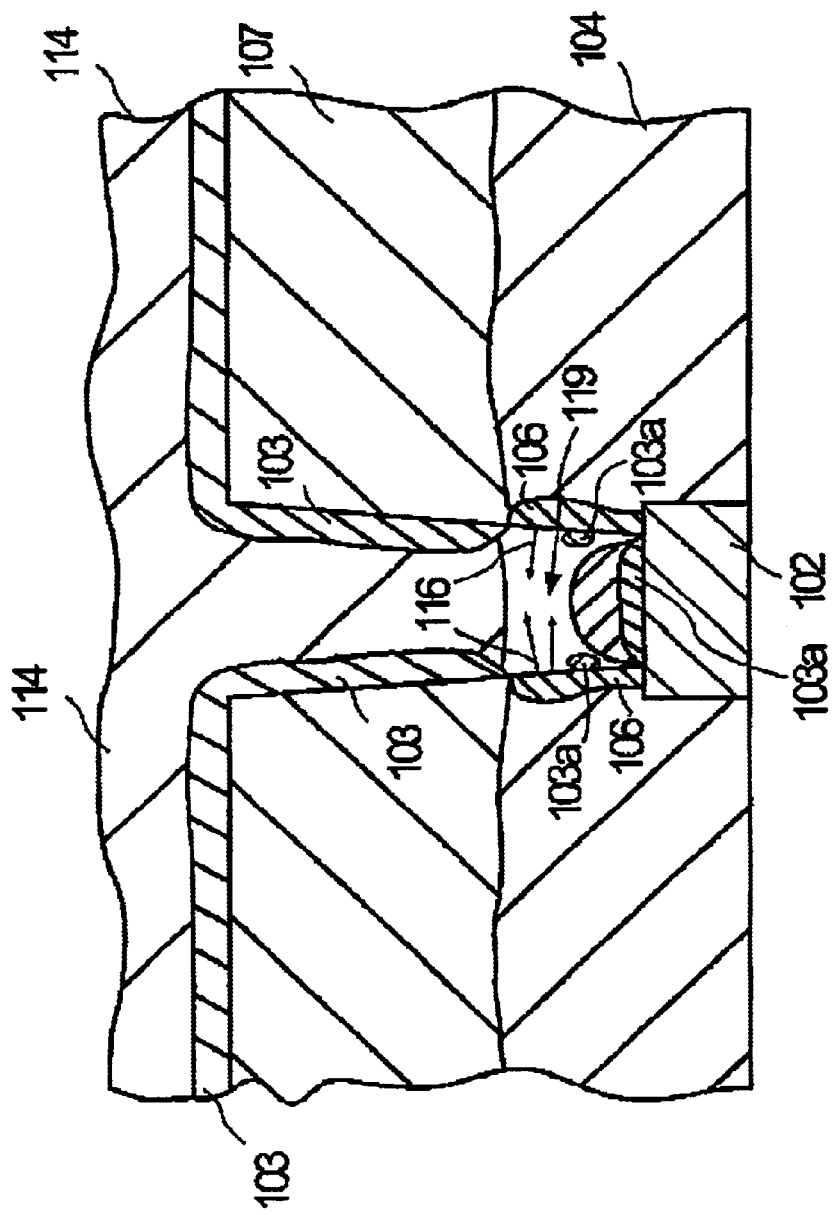
FIG. 1C is a cross sectional view of the semiconductor structure shown in FIGS. 1A and 1B after an unsuccessful attempt to deposit a complete layer of titanium nitride, showing an undesired discontinuous characteristic of the titanium nitride caused by outgassing of the undesired surface layer of oxidized SOG material.
Figure 2A:
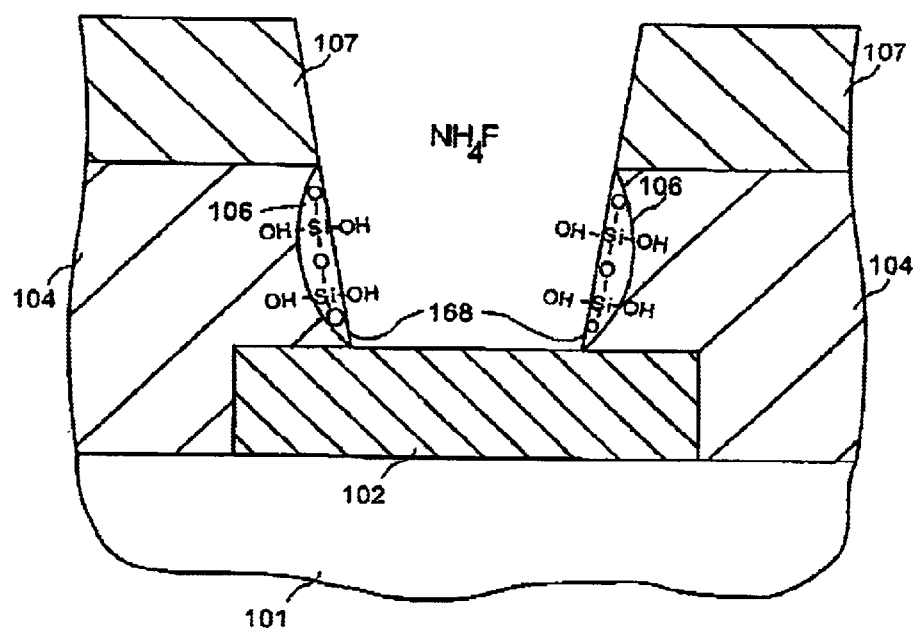
FIG. 2A is a cross sectional view of the semiconductor structure shown in FIG. 1B, showing a process of the present invention including a chemical dehydroxylation operation performed on the surface layer of silicon dioxide to convert the surface layer of silicon dioxide to provide the surface layer of hydrophobic material of the present invention.

FIG. 2A shows one embodiment of a chemical dehydroxylation operation of the present invention performed on the surface layer 106 of silicon dioxide to convert such layer 106 to a hydrophobic material. The operation may be performed on SOG material of the layer 104, such material having the characteristic of spin on glass. The SOG material is taken from the group consisting of the true spin on glass described above, and the SOG-like material described above as including, for example, an organic vapor-deposited low thermal expansion coefficient material, and other spin coated low K dielectrics. Such SOG material of the layer 104 has the characteristic of spin on glass as shown in FIG. 1C, and has the oxidized surface layer 106 of silicon dioxide. The chemical dehydroxylation operation uses a halogen compound.

Figure 2B:
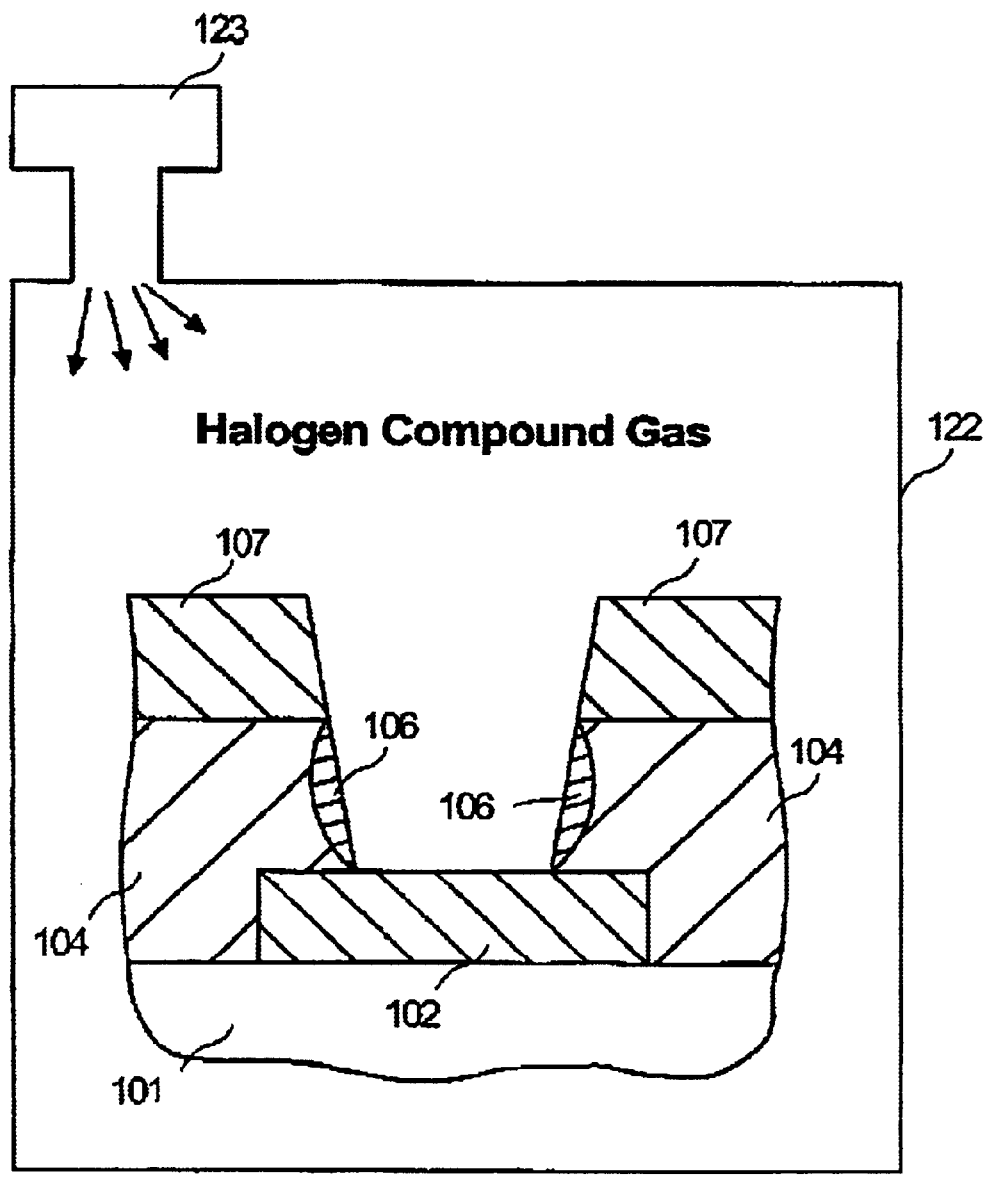
FIG. 2B is a schematic view of a process chamber in which the chemical dehydroxylation operation is performed, showing the semiconductor structure with the surface layer of silicon dioxide which is to be converted to the surface layer of hydrophobic material of the present invention.

FIG. 2B shows an example chamber apparatus for performing the chemical dehydroxylation operation in accordance with this embodiment. The chemical dehydroxylation operation is performed by placing the semiconductor structure of FIG. 2A in a closed process chamber 122. It should be noted that many types of chambers may be used, and one or more wafers may be placed in a chamber at one time. For example, when more than one wafer is placed in the chamber in a batch, the wafers are preferably held in a wafer carrier. A halogen supply 123 is configured to be admitted into the closed process chamber 122, such that the halogen compound is capable of facilitating the chemical dehydroxylation operation. The preferred flow rate of the halogen supply is preferably set between about 10 sccm and about 50 sccm, and most preferably set to about 20 sccm. The halogen compound used in the chemical dehydroxylation operation may be $NH_4F$ or $CCl_4$, for example. Upon causing the chemical dehydroxylation operation, by-product gases, such as, $NH_3$ and vapor $H_2O$ are believed to be formed. These by-product gases may then be removed from the chamber using any number of conventional techniques.

Figure 2C:
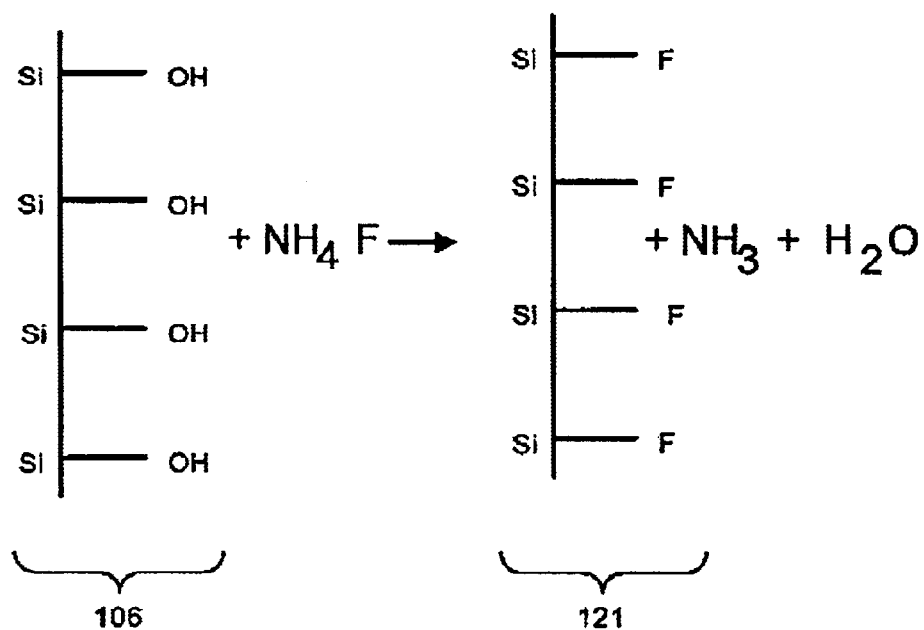
FIG. 2C is a schematic illustration of the process of converting the silicon dioxide layer to the hydrophobic layer.

FIG. 2C schematically shows the reaction of surface OH groups (ie., Si—OH) of the silicon dioxide of surface layer 106 with the $NH_4F$. The silicon dioxide of the layer 106 is shown reacting with the $NH_4F$, such that the fluorine (F) vapors replace the OH groups, and thereby results in a hydrophobic layer 121. The hydrophobic layer is thus $Si_5F$. Of course, other fluorine containing gases may also be used to cause the replacement of the OH groups and produce the hydrophobic layer 121.

Figure 2D:
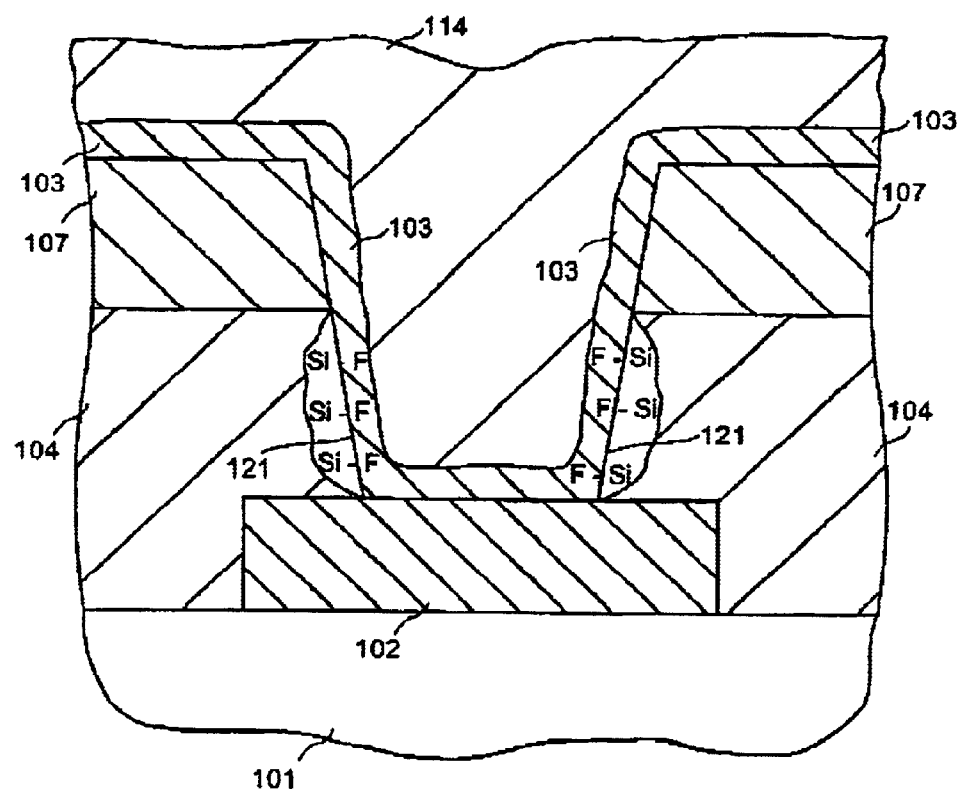
FIG. 2D is a cross sectional view of the semiconductor structure shown in FIG. 2A, showing a result of the process of the present invention as including the provision of the surface layer of hydrophobic material of the present invention.

FIG. 2D schematically depicts the result of the chemical dehydroxylation operation, illustrating the hydrophobic layer 121 as a layer that defines the walls of the via hole. The hydrophobic layer 121 is shown having the fluorine (F) at the surface, instead of the porous OH interface shown at the surface of the layer 106 in FIG. 2A. Significantly, FIG. 2D shows the titanium nitride layer 103 as being a continuous layer which is permitted to be deposited in such continuous manner against the surface of the hydrophobic layer 121. Further, FIG. 2D shows the tungsten layer 114 filling the via hole substantially against the continuous surface of layer 103, and thereby making a good electrical contact with the first conductor 102.

Figure 3A:
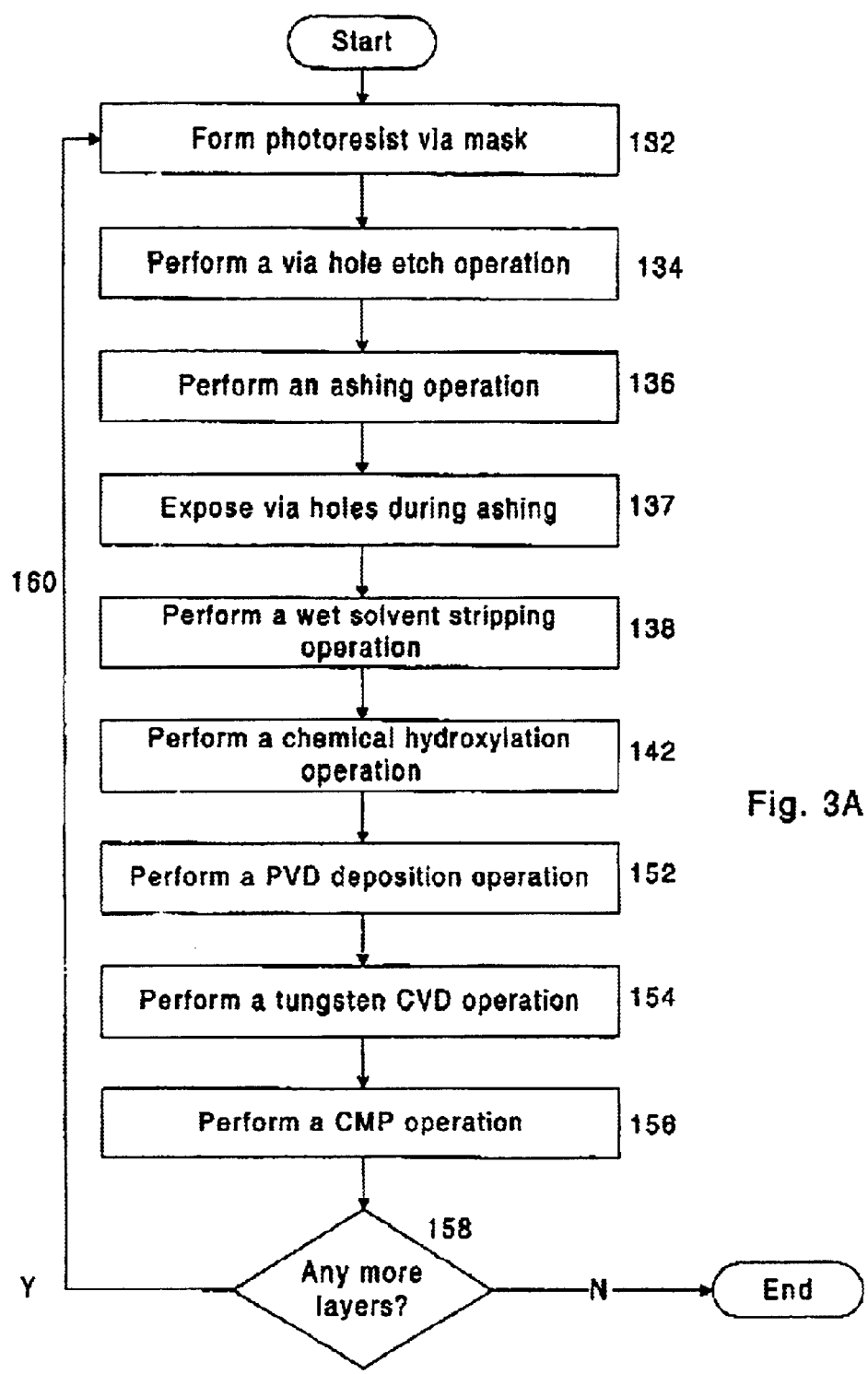
FIG. 3A is a flow chart depicting operations of the process of the present invention.
Figure 3B:
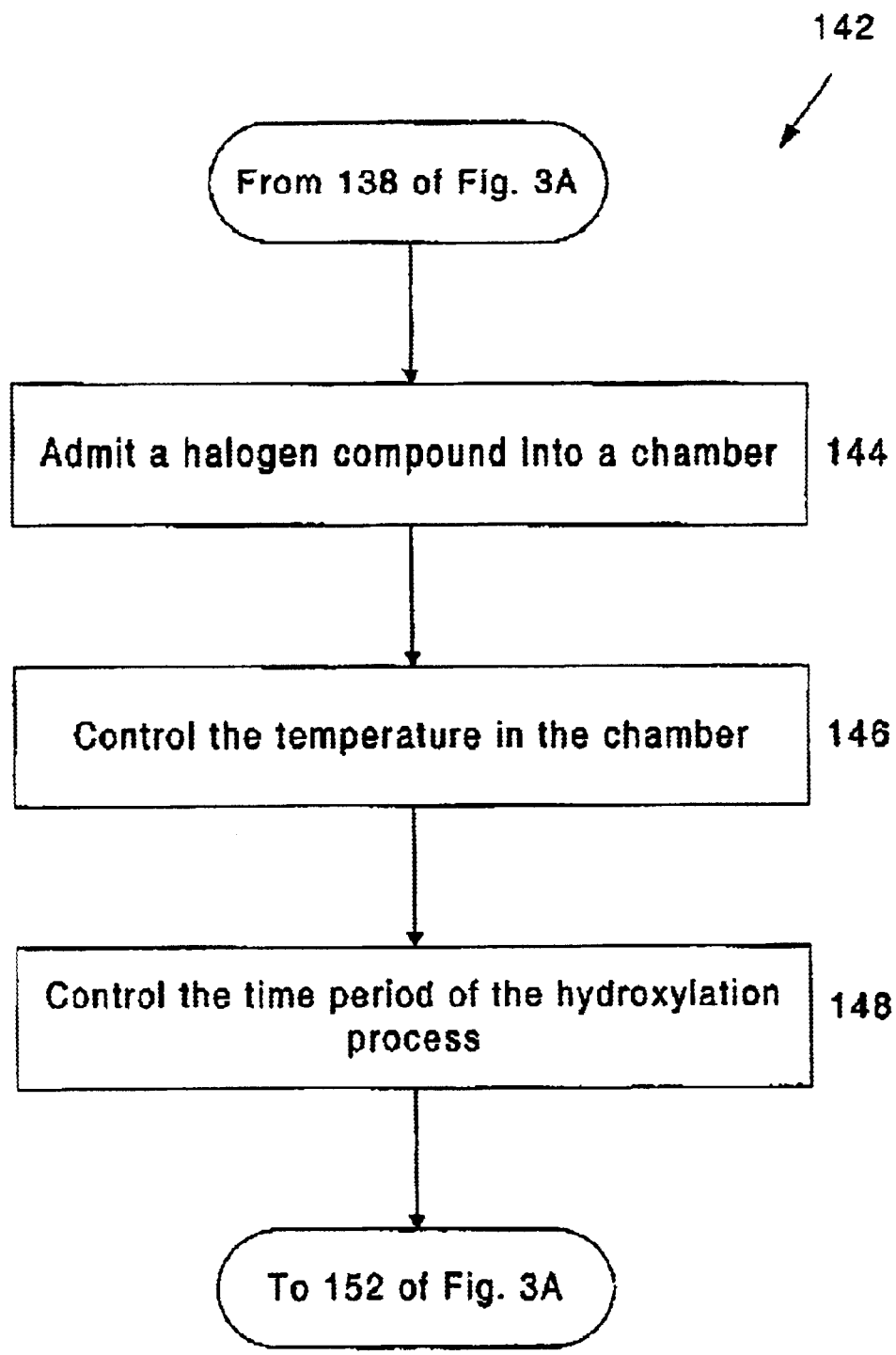
FIG. 3B is a flow chart illustrating sub-operations of a chemical dehydroxylation operation shown in FIG. 3A.

A process of the present invention may include a series of operations depicted in FIG. 3A. The process may start with a structure such as that shown in prior FIG. 1A, where an operation 132 spin coats the photoresist layer 108 onto the silicon dioxide layer 107 to define the intended location and size of a via, or a plurality of vias of an integrated circuit device. An operation 134 then etches the via hole or holes in the layers 104 and 107. An ashing operation 136 is performed to remove the photoresist and define the structure shown in FIG. 1B, and the SOG layer 104 is exposed in operation 137 to atmosphere and becomes oxidized. As a result, the surface layer 106 becomes defined in the SOG layer 104 as shown in FIG. 1B. Further processing is performed in an operation 138 to remove side wall polymers (not shown) formed during etching, for example. Such removal is typically done using a wet solvent stripper.

To avoid the disadvantages of the prior art, the process of the present invention includes a chemical dehydroxylation operation 142, as described above. In more detail, this operation 142 includes sub-operations shown in FIG. 4B, including an admitting sub-operation 144 by which the halogen compound is introduced into a closed process chamber 122. The admitting operation 144 is performed until the pressure in the chamber 122 is broadly from about 1.5 to 3.0 atmospheres, and is more preferably from about 1.5 and about 2.0 atmospheres. In a sub-operation 146, the temperature in the chamber 122 is controlled to be from about 100 degrees C. to less than about 450 degrees C., and more preferably from about 100 degrees C. to less than about 200 degrees C., and most preferably at about 120 degrees C. In an operation 148, the chemical dehydroxylation operation 142 is performed for a period from about 0.5 to 6 minutes, and more preferably for a period of about 1 minutes to about 3 minutes, and most preferably for 2 minutes. The operation 142, including the sub-operations 144, 146, and 148, results in the forming of the hydrophobic layer 121 shown in FIG. 2D, which is the surface of the via hole onto which it is desired to deposit the titanium nitride layer 103.

Figure 1D:
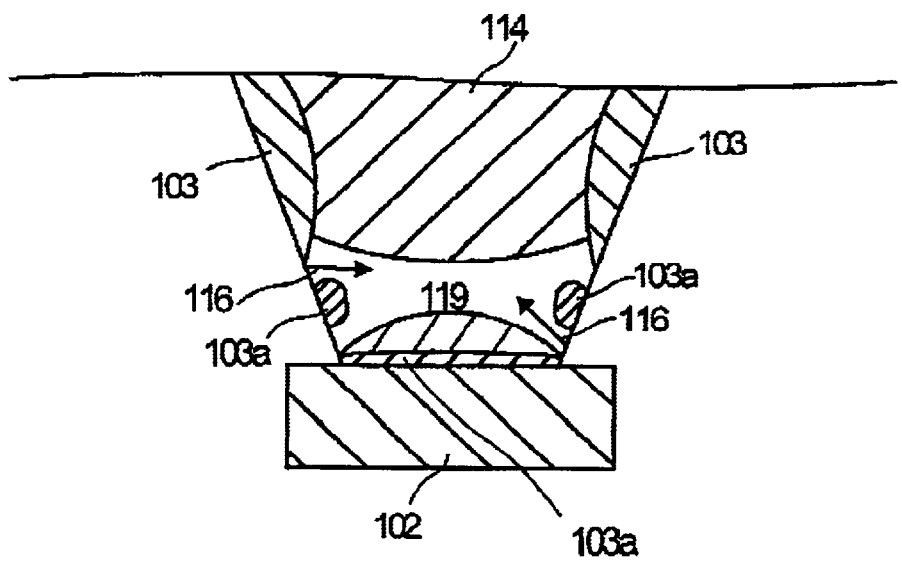
FIG. 1D is an enlarged view of a portion of the structure shown in FIG. 1C, illustrating a void defined due to the failure of a tungsten layer to be deposited completely in the via hole surface walls due to outgassing of moisture from the undesired surface layer of oxidized SOG material.

When the halogen compound used in the operation 142 is $NH_4F$, a physical vapor deposition (PVD) operation 152 may be used to deposit the continuous titanium nitride layer 103 in the via hole or via holes, which results in a continuous, conductive layer being provided over and in contact with the hydrophobic layer 121 and in electrical contact with the first conductor 102. In FIG. 2D, such continuous layer 103 is distinguished from the discontinuous layer 103/103a shown in FIGS. 1C and 1D.

Then, in an operation 154, a chemical vapor deposition (CVD) operation may be used to deposit the tungsten layer 114 in the via hole and in direct contact with the titanium nitride layer 103. The tungsten layer 114 is also a continuous layer, that is, a layer that completely fills the via hole and that is in direct electrical contact with substantially all of the titanium nitride layer 103. Then, a chemical mechanical polishing (CMP) operation is used to planarize the top of the via hole of FIG. 2D. For example, the CMP operation will preferably remove the excess tungsten material and TiN material down to the layer 107. Following the CMP operation, an operation 158 determines whether there are any more semiconductor structures, i.e., conductive vias to fabricate at other layers of the semiconductor device. If the determination is yes, then a loop 160 is taken to operation 132, and such operation 132 is performed for the next via structure or structures. If the determination is no, then after the operation 158, the operations ends.

A further embodiment of the present invention contemplates the halogen compound being $CCl_4$, rather than $NH_4F$ in the chemical dehydroxylation operation 142, and more specifically in the admitting operation 144. In this embodiment, in the operation 152, cooper is preferably used to fill the via holes over the surface layer 121 of hydrophobic material. After the copper layer, further operations may be performed as described above, resuming with operation 156.

It should be understood then, that an advantage of each of the described embodiments is that no high temperature outgassing is required to avoid the disadvantages of the porous surface layer 106 of silicon dioxide. Instead of such undesired high temperature outgassing, the layer 106 is converted into the hydrophobic layer 121, which thus allows the titanium nitride materials, copper materials, aluminum materials, or any other type of via fill metallization to be properly deposited in the via hole. Thus, the resulting via hole structures will be substantially more reliable than conventional via structures.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A semiconductor via structure being defined through an inter-metal dielectric, comprising:
    a first conductive pattern element; and
    a layer of SOG material formed over the first conductive pattern element, the layer of SOG material having a via hole defined therethrough, such that the via hole defines a path to the first conductive pattern element,
    wherein the via hole has a via wall surface, the via wall shape is defined along the SOG material that extends to the first conductive pattern element, and the via wall surface has a hydrophobic material layer.

2. A semiconductor via structure being defined through an inter-metal dielectric as recited in claim 1, wherein the hydrophobic material layer is a reaction product of silicon dioxide and a halogen compound.

3. A semiconductor via structure being defined through an inter-metal dielectric as recited in claim 2, wherein the halogen compound is $NH_4F$.

4. A semiconductor via structure being defined through an inter-metal dielectric as recited in claim 2, wherein the halogen compound is $CCl_4$.

5. A semiconductor via structure being defined through an inter-metal dielectric as recited in claim 3, further comprising:
    a layer coating the via hole in direct substantially continuous contact with the hydrophobic material layer, the layer coating being a titanium nitride material.

6. A semiconductor via structure being defined through an inter-metal dielectric as recited in claim 5, further comprising:
    a conductive fill material contained within the via hole and in direct substantially continuous contact with the layer coating.

7. A semiconductor via structure being defined through an inter-metal dielectric as recited in claim 6, further comprising:
    a second conductive pattern element in conductive contact with the conductive fill material, the titanium nitride material, and the first conductive pattern element, thereby defining a reliable conductive interconnection between a first metal layer network that includes the first conductive pattern element and a second metal layer network that includes the second conductive pattern element.

8. The semiconductor via structure of claim 1, further comprising a dielectric layer positioned on the layer of SOG material, the dielectric layer being positioned over the hydrophobic material layer.

9. The semiconductor via structure of claim 1, wherein the layer of SOG material and the dielectric layer each include silicon dioxide and the hydrophobic material layer includes halogen atoms bonded to silicon atoms.

10. A semiconductor apparatus, comprising:
    a substrate;
    a conductor positioned on the substrate;
    a first dielectric layer in contact with at least a portion of the conductor;
    a second dielectric layer on the first dielectric layer; and
    a via defined through the first dielectric layer and the second dielectric layer, the first dielectric layer including a hydrophobic material portion defining a via wall, the hydrophobic material including halogen atoms bonded to silicon atoms; and
    a metal layer positioned on the second dielectric layer and extending into the via to electrically connect to the conductor.

11. The apparatus of claim 10, wherein the first dielectric layer and the second dielectric layer include silicon dioxide. between the metal layer and the second dielectric layer.

12. The apparatus of claim 10, further comprising an electrically conductive layer between the metal layer and the second dielectric layer.

13. The apparatus of claim 12, wherein the metal layer includes tungsten and the conductive layer includes titanium nitride.

14. The apparatus of claim 13, wherein the halogen atoms are fluorine atoms.

15. The apparatus of claim 10, wherein the halogen atoms are chlorine atoms and the metal layer includes copper.

16. An apparatus, comprising:
    a chamber;
    a halogen supply to provide a halogen-containing gas to the processing chamber,
    a semiconductor device positioned in the chamber, the semiconductor device including:
        a substrate;
        a conductor formed on the substrate;
        a first dielectric layer positioned on the conductor;
        a second dielectric layer positioned on the first dielectric; and
    wherein the first dielectric layer and the second dielectric layer define a via hole; a via hole wall surface of the first dielectric layer including a porous material of silicon bonded to hydroxyl groups indicative of a SOG dielectric material, porosity of a via hole wall surface of the second dielectric layer is greater than the first dielectric layer, and the processing chamber and the halogen supply are controlled to cause a reaction between the halogen-containing gas and the porous material to provide a hydrophobic material by exchanging the hydroxyl groups with halogen atoms.

17. The apparatus of claim 16, wherein the dielectric layer and the second dielectric layer each include silicon dioxide and the halogen-containing gas is in the form of $CCl_4$ or $NH_4F$.

* * * * *